(12) United States Patent
Chien et al.

(10) Patent No.: US 8,232,202 B2
(45) Date of Patent: Jul. 31, 2012

(54) IMAGE SENSOR PACKAGE AND FABRICATION METHOD THEREOF

(76) Inventors: Wen-Cheng Chien, Taoyuan (TW); Wang-Ken Huang, Taoyuan (TW)

(*) Notice: Subject to any disclaimer, the term of this patent is extended or adjusted under 35 U.S.C. 154(b) by 134 days.

(21) Appl. No.: 11/905,573

(22) Filed: Oct. 2, 2007

(65) Prior Publication Data

US 2009/0014826 A1 Jan. 15, 2009

(30) Foreign Application Priority Data

Jul. 13, 2007 (TW) .............................. 96125589 A

(51) Int. Cl.
*H01L 21/44* (2006.01)
(52) U.S. Cl. ................. 438/667; 257/E21.597
(58) Field of Classification Search ........... 257/E23.174, 257/E21.597; 438/667, 64, 65, 637
See application file for complete search history.

(56) References Cited

U.S. PATENT DOCUMENTS

| | | | |
|---|---|---|---|
| 5,691,248 A * | 11/1997 | Cronin et al. ................. | 438/109 |
| 6,777,767 B2 * | 8/2004 | Badehi ........................... | 257/432 |
| 6,894,358 B2 | 5/2005 | Leib et al. | |
| 6,911,392 B2 | 6/2005 | Bieck et al. | |
| 7,071,521 B2 | 7/2006 | Leib et al. | |
| 7,160,478 B2 | 1/2007 | Leib et al. | |
| 7,285,834 B2 | 10/2007 | Leib et al. | |
| 7,488,680 B2 * | 2/2009 | Andry et al. .................. | 438/624 |
| 7,566,944 B2 * | 7/2009 | Wang et al. ................... | 257/459 |
| 7,767,544 B2 * | 8/2010 | Borthakur ..................... | 438/456 |
| 2005/0164490 A1 * | 7/2005 | Morrow et al. ............... | 438/629 |
| 2005/0194670 A1 * | 9/2005 | Kameyama et al. .......... | 257/678 |
| 2006/0038300 A1 * | 2/2006 | Tanida et al. ................. | 257/773 |
| 2006/0055050 A1 * | 3/2006 | Numata et al. ................ | 257/774 |
| 2006/0180887 A1 | 8/2006 | Ono | |
| 2007/0257373 A1 * | 11/2007 | Akram et al. ................. | 257/774 |
| 2007/0259517 A1 * | 11/2007 | Benson et al. ................ | 438/618 |
| 2008/0138975 A1 * | 6/2008 | Pratt ............................. | 438/618 |
| 2008/0280435 A1 * | 11/2008 | Klootwijk et al. ............ | 438/667 |
| 2008/0303139 A1 * | 12/2008 | Bernstein et al. ............. | 257/723 |
| 2009/0001495 A1 * | 1/2009 | Weng et al. ................... | 257/433 |
| 2009/0014891 A1 * | 1/2009 | Chang et al. .................. | 257/777 |
| 2009/0120679 A1 * | 5/2009 | Andry et al. .................. | 174/262 |
| 2010/0044853 A1 * | 2/2010 | Dekker et al. ................ | 257/692 |
| 2010/0123256 A1 * | 5/2010 | Yoda et al. .................... | 257/774 |

FOREIGN PATENT DOCUMENTS

| | | |
|---|---|---|
| JP | 6-113214 | 4/1994 |
| JP | 10-335337 | 12/1998 |
| JP | 2001-351997 | 12/2001 |

* cited by examiner

*Primary Examiner* — Matthew Landau
*Assistant Examiner* — Latanya N Crawford
(74) *Attorney, Agent, or Firm* — Birch, Stewart, Kolasch & Birch, LLP

(57) ABSTRACT

An image sensor package and a method for fabricating thereof are provided. A substrate having an insulator filled cavity is provided with an image sensor device electrical connected to a metal layer, thereon. A covering plate is then disposed on the substrate. The substrate is subsequently thinned to expose the insulator. Removing a portion of the insulator, a hole is formed and a conductive layer is filled therein to form a via hole. Next, a solder ball is located over a backside of the substrate which is electrically connected to the metal layer through the via hole. The image sensor package is thinned, thus, the dimensions thereof are reduced.

20 Claims, 6 Drawing Sheets

IMAGE SENSOR PACKAGE AND FABRICATION METHOD THEREOF

BACKGROUND OF THE INVENTION

1. Field of the Invention

The invention relates to image sensor packages, and more particularly to an image sensor package with relatively small dimensions and a method for fabricating thereof.

2. Description of the Related Art

Photosensitive integrated circuits play an important role in image sensor devices which are widely used in consumer devices, such as digital cameras, digital video recorders, mobile phones, and portable devices. With the consumer's demanding lighter and lighter portable devices, requirement to reduce the dimensions of image sensor packages has increased.

Referring to FIG. 1, a cross section of a conventional image sensor package 1 is shown. In FIG. 1, a substrate 2 with an image sensor device 4 electrically connected to an extending bonding pad 6 thereon is provided. A covering plate 8 is then disposed on the substrate 2 followed by the substrate 2 being attached to a carrying plate 14. As shown in FIG. 1, a conductive layer 10 is formed on a backside of the carrying plate 14 and extended to the sidewalls of the carrying plate 14 and the substrate 2 to electrically connect the extending bonding pad 6 to a solder ball 12. The image sensor package has large dimensions since the image sensor package structures require both the substrate and the carrying plate to comprise certain thicknesses. Moreover, because the conductive layer is formed close to an exterior area of the image sensor package, for example the sidewalls of the substrate and the carrying plate, damage to the conductive layer may occur during fabrication, resulting in device failure.

Thus, an image sensor package having relatively small dimensions and fabrication method thereof is needed.

BRIEF SUMMARY OF INVENTION

Accordingly, the invention provides an image sensor package. An exemplary embodiment of the image sensor package comprises a substrate having a via hole, an image sensor device electrical connecting with a metal layer and a covering plate. The package further comprises a conductive layer, which is formed on a backside of the substrate, and a solder ball, which is located on the conductive layer. The solder ball electrically connects to the metal layer through the via hole and thereby receives a signal from the image sensor device.

Also, the invention provides a method for fabricating an image sensor package. The method comprises: providing a substrate having a cavity, in which an insulator is filled; forming an image sensor device in electrical connection with a metal layer on the substrate; disposing a covering plate on the substrate; thinning the substrate to expose the insulator; removing a portion of the insulator to form a hole therein; forming a conductive layer on a backside of the substrate and extended to the hole to form a via hole; and disposing a solder ball on the conductive layer which is electrically connected to the metal layer.

Since the substrate is thinned to reduce the overall thickness of the image sensor package, the dimensions thereof are relatively small. Moreover, because extra steps, such as bonding a chip to a carrying plate or separating the chip, is not required, fabrication of the image sensor package is simplified and costs are also reduced.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Referring to FIGS. 2 through 8, cross sections illustrating a method for fabricating an image sensor package according to an embodiment of the invention are shown. The invention will be described with respect to a preferred embodiment in a method for fabricating an image sensor package. The invention may also be applied, however, to manufacturing other semiconductor devices.

Figure 1:
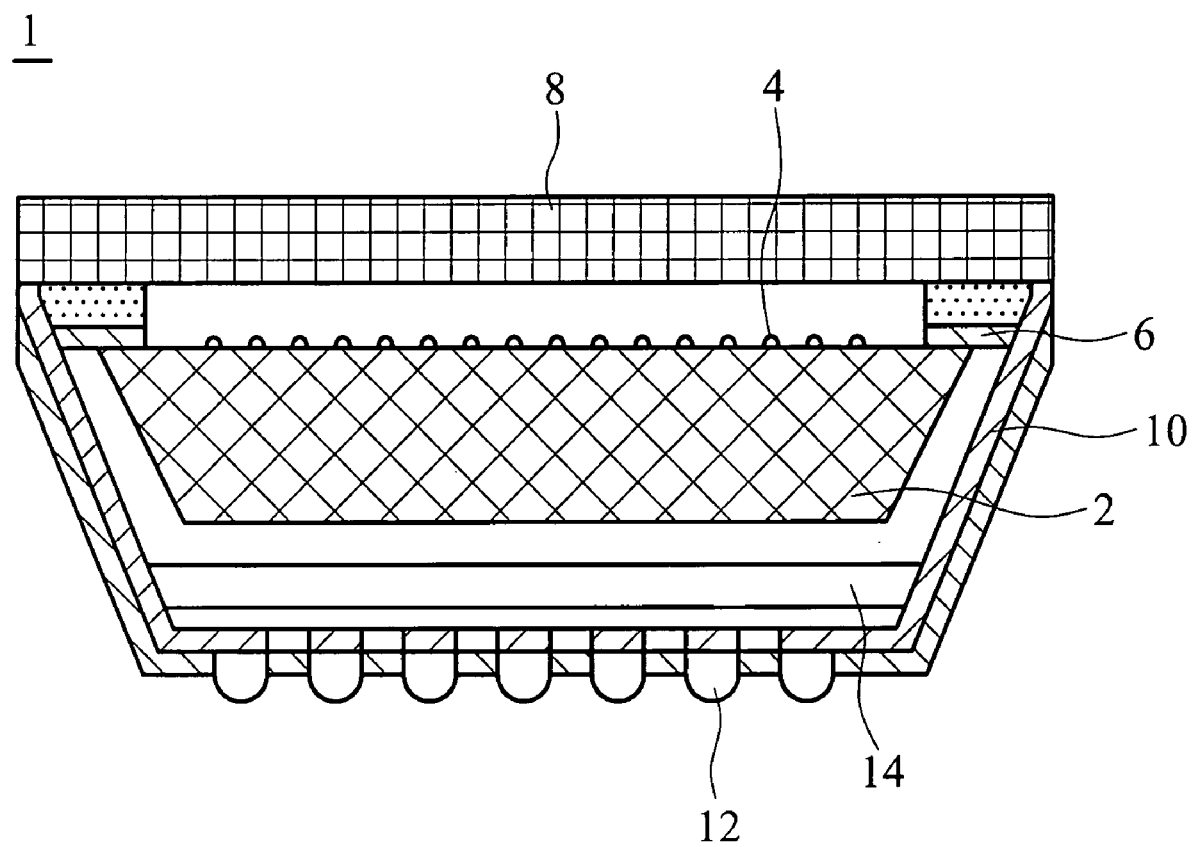
FIG. 1 is a cross section of a conventional image sensor package.
Figure 2:
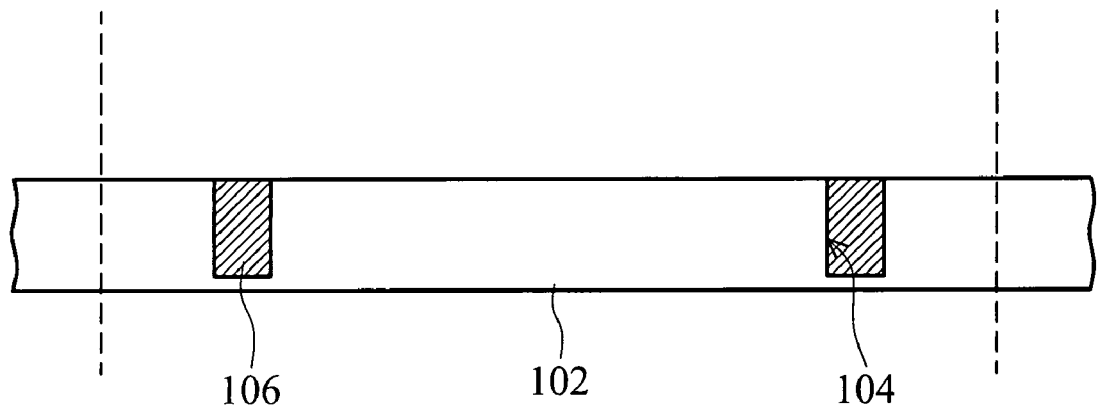
FIGS. 2 through 8 are cross sections illustrating a method for fabricating an image sensor package according to an embodiment of the invention.

Referring to FIG. 2, a substrate 102 having a cavity 104 is provided with an insulator 106 filled therein. In one embodiment, the cavity 104 is formed in the substrate 102 by etching an upper surface of the substrate 102 by dry-etching or wet-etching. Next, an insulating material layer (not shown) is conformally deposited on the upper surface of the substrate 102 and extended to the cavity 104 by, for example chemical vapor deposition (CVD), plasma enhanced chemical vapor deposition (PECVD), or coating. A portion of the insulating material layer is then removed to expose the upper surface of the substrate and form the insulator 106 in the cavity 104.

Preferably, the substrate 102 is made of silicon or any other suitable semiconductor materials. The insulator 106 is preferably made of polymer such as photoresist, dielectric material such as silicon oxide or silicon nitride, or any other suitable insulating materials.

Figure 3:
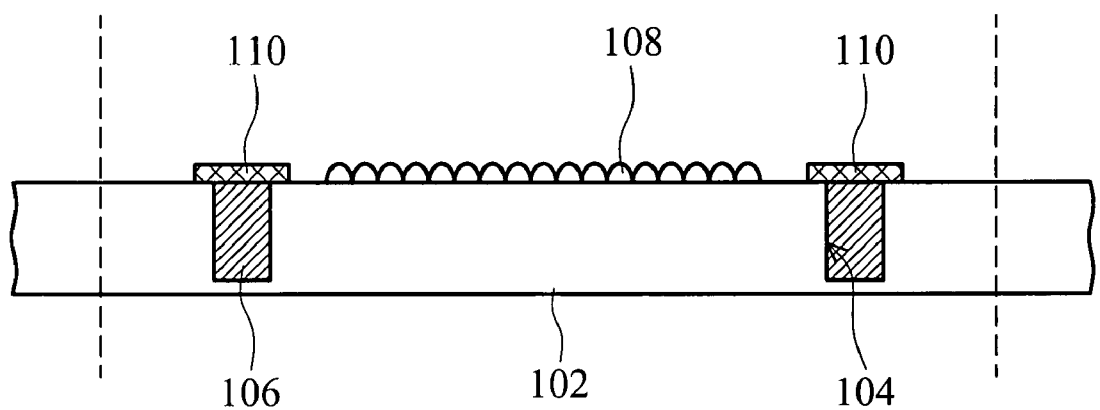

Referring to FIG. 3, an image sensor device 108, for example complementary metal-oxide-semiconductor (CMOS) or charge-coupled device (CCD), is fabricated on the upper surface of the substrate 102. A metal layer 110 in electrical connection with the image sensor device 108 is formed on the insulator 106. In some embodiments, the image sensor device 108 is fabricated by a CMOS process. Then, the metal layer 110, such as aluminum (Al), copper (Cu) or tungsten (W), is formed on the insulator 106 and electrically connected to the image sensor device 108.

Note, that while metal layer 110 illustrated as a signal layer in the embodiments of the invention, the metal layer 110 may also be an interconnecting structure comprising of dielectric layers sandwiched between numbers of metal layers, whereby the metal layers are connected to each other by the metal plugs. In one embodiment of the interconnecting structure, the bottommost metal layer is directly formed on the insulator in the cavity and the uppermost metal layer is stacked over the bottommost metal layer to electrically connect the image sensor device and the bottommost metal layer.

Figure 4:
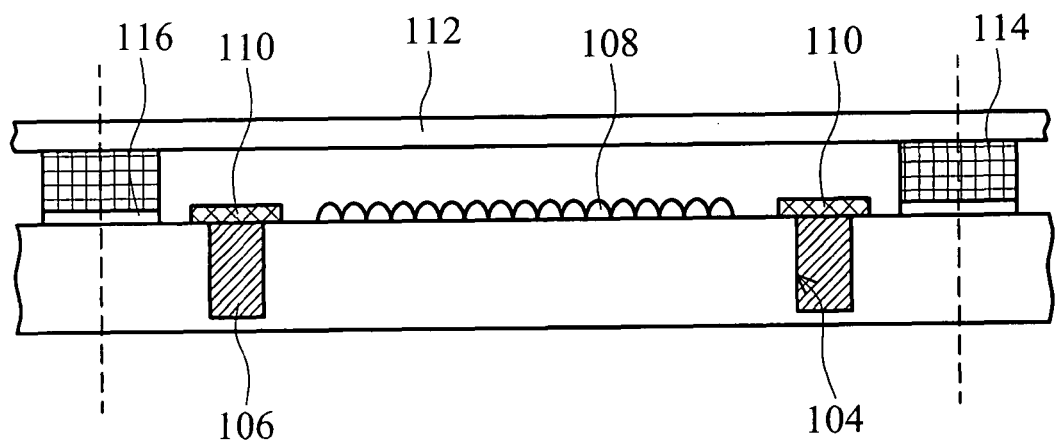

Referring to FIG. 4, a covering plate 112 is disposed on the substrate 102. In one embodiment, a support member 114, such as photoresist, epoxy or polyimide (PI), is formed on the covering plate 112. An adhesive layer 116 is coated on the support member 114 followed by bonding the covering plate 112 onto the substrate 102. Preferably, the covering plate 112 is made of a material, for example glass, quartz, polymer such as polyester or any other suitable materials. Moreover, a protective layer (not shown) is optionally formed on the opposite side of the covering plate 112 to the side where the support member 114 is located to avoid abrasion.

In an alternative embodiment, the support member 114 is formed on the substrate 102 followed by coating the adhesive layer 116 on the support member 104. Next, the covering plate 112 is disposed on the support member 104 to bond the covering plate 112 onto the substrate 102.

Figure 5:
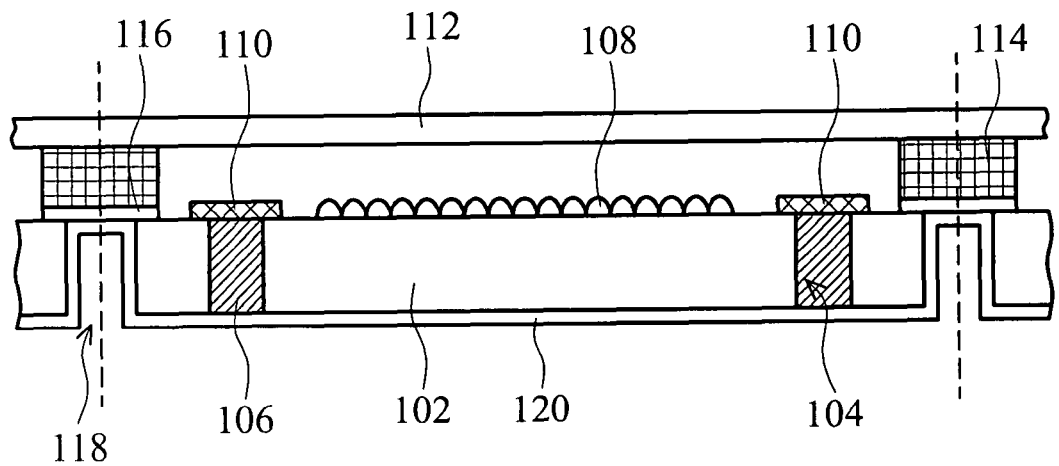

In FIG. 5, a lower surface of the substrate 102 is ground to thin the substrate 102. In one embodiment, a portion of the substrate 102 is removed by, for example chemical mechanical polishing (CMP), to expose the insulator 106 in the cavity 104 (shown in FIG. 2). Next, by notching the lower surface of the substrate 102 by dry-etching or notch equipments, a trench 118 is formed.

As shown in FIG. 5, an insulating layer 120 is formed on the lower surface of the substrate 102 and extends to the trench 118. Preferably, material and formation of the insulating layer 120 is similar to that of the insulator 106.

Figure 6:
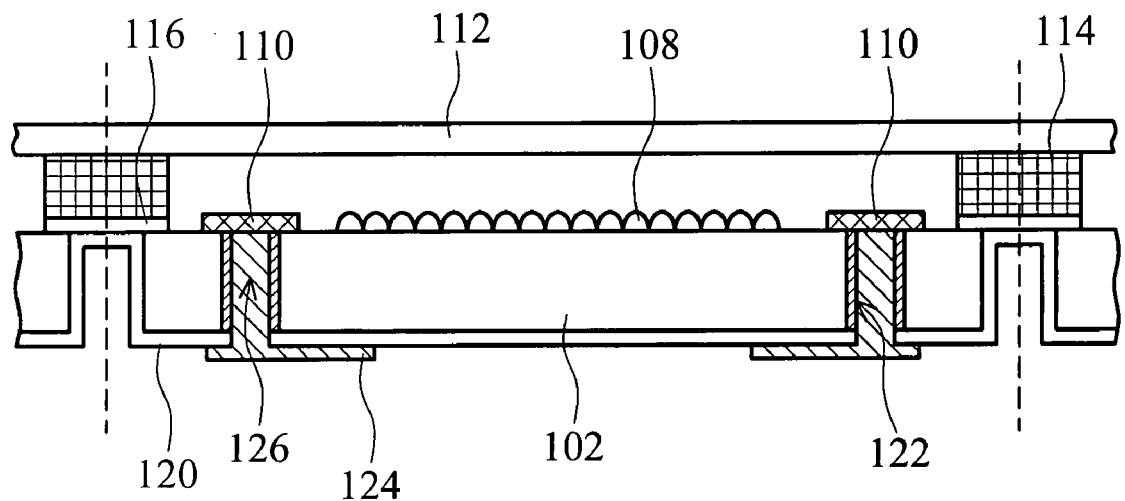

Referring to FIG. 6, a portion of the insulating layer 120 and a portion of the insulator 106 are removed to form a hole 122 in the insulator 106. A conductive layer 124 is formed on the lower surface of the substrate 102 and extends to the hole 122 to form a via hole 126 in the substrate 102. In some embodiment, a conductive material layer (not shown), such as copper (Cu), aluminum (Al) or nickel (Ni), is conformally deposited on the lower surface of the substrate 102 and extends to the hole 122 by, for example sputtering, evaporating, electroplating or electroless plating. Patterning the conductive material layer by photolithography and etching, the conductive layer 124 and the via hole 126 are then formed.

It is appreciated that the upper surface may referred to as a frontside and the lower surface as a backside.

Note that because the conductive material layer is patterned, a signal conductive path of an image sensor package later formed is redistributed. Moreover, because the conductive material is formed from the lower surface of the substrate 102, through the hole 122 and to the metal layer 110, a signal from the image sensor device 108 is transmitted to an exterior circuit by the metal layer 110, the via hole 126 and conductive layer 124 without passing through the sidewalls of the substrate. Thus, the signal conductive path of the image sensor package is shortened.

Figure 7:
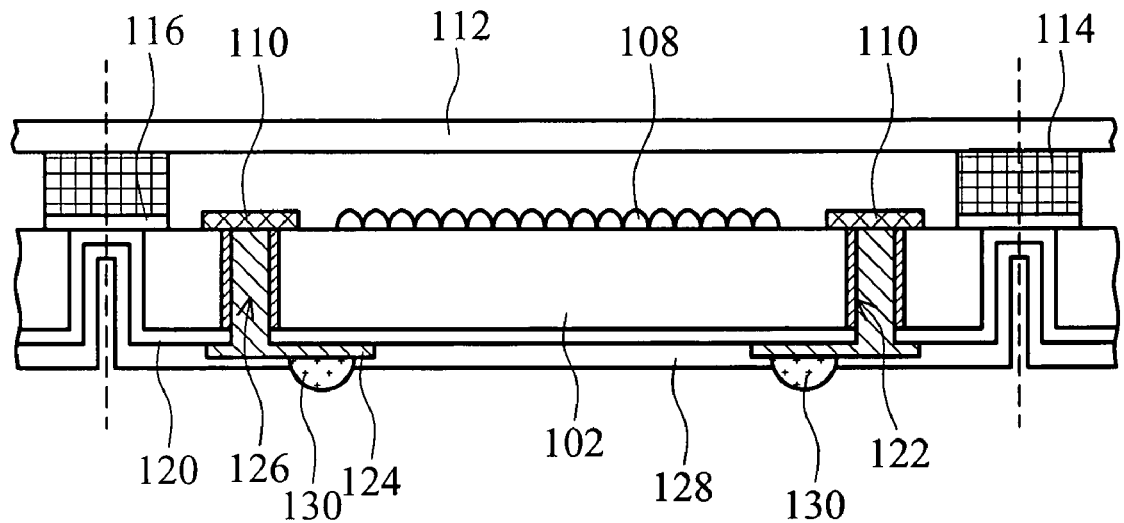

Referring to FIG. 7, a solder ball 130 is formed on the conductive layer 124 and electrically connects to the metal layer 110. In one embodiment, prior to forming the solder ball 130, a solder mask 128 is coated on the conductive layer 124 and is then patterned to expose a portion of the conductive layer 124. Next, a solder material is coated on the exposed conductive layer 124 followed by performing a reflow process to form the solder ball 130 on the conductive layer 124. An individual die is cut out along a predetermined cutting line. Thus, fabrication of the image sensor package 150, as shown in FIG. 8, is complete.

Figure 8:
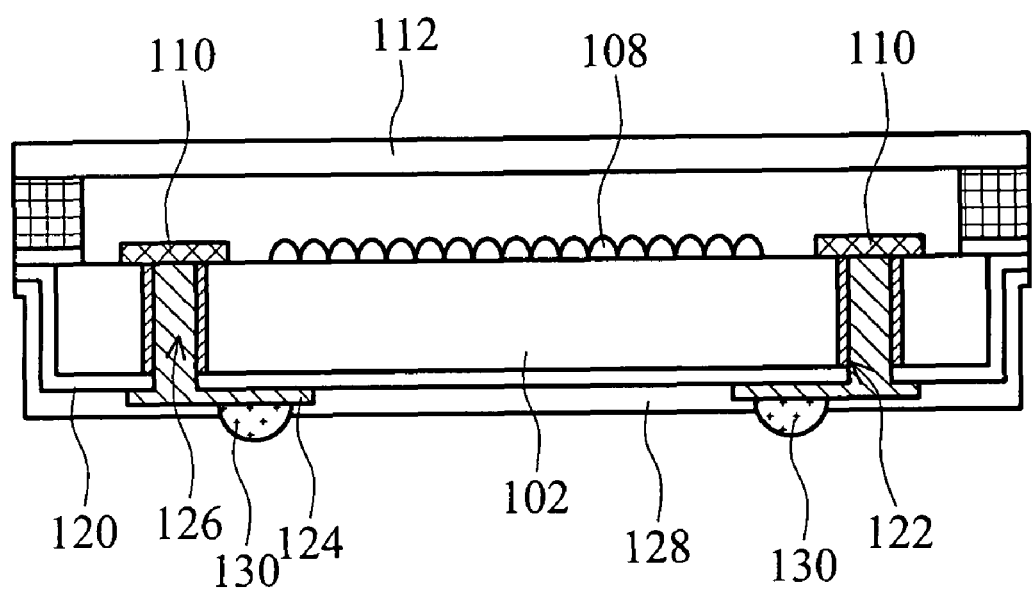

Referring to FIG. 8, a cross section of an image sensor package 150 according to the embodiment of the invention is shown. In FIG. 8, a substrate 102 having a via hole 126 is provided. An image sensor device 108 in electrical connection with a metal layer 110 is formed on a frontside of the substrate 102. A covering plate 112 is then disposed on the substrate 102. A conductive layer 124 is formed on a backside of the substrate 102 and a solder ball 130 in electrical connection with the metal layer 110 is formed thereon.

Figure 9:
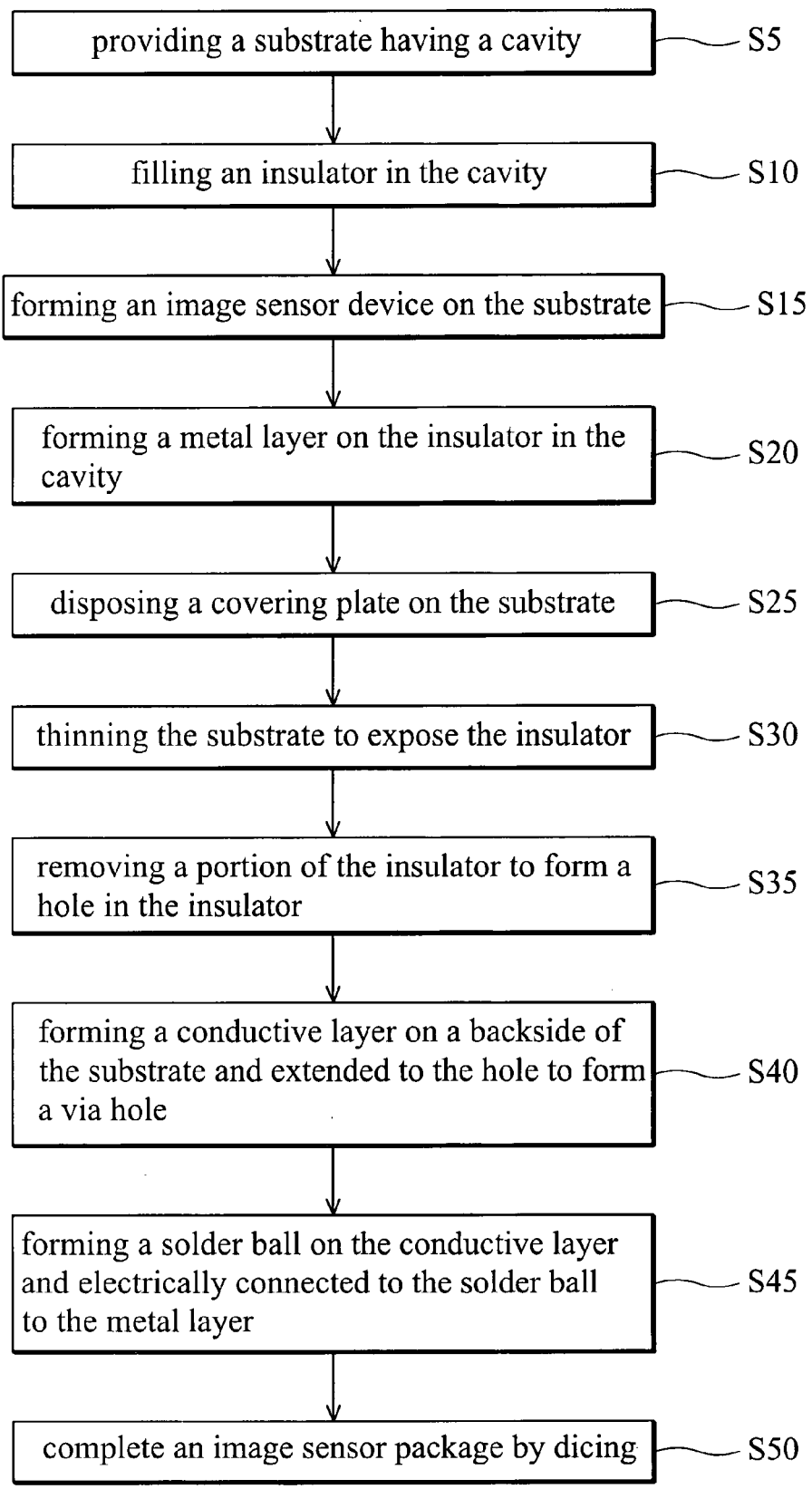
FIG. 9 is flow chart of a method for fabricating an image sensor package according to an embodiment of the invention.

Referring to FIG. 9, a flow chart of method for fabricating an image sensor package according to the embodiment of the invention is shown. In the flow chart, at first, a substrate having a cavity is provided, as shown in step S5. Next, an insulator is filled in the cavity, as shown in step S10. Then, an image sensor device is formed on the substrate followed by forming a metal layer on the insulator in the cavity, which is electrically connected to the image sensor device, as shown in steps S15 and S20. Next, a covering plate is disposed on the substrate, as shown in step S25. Following, the substrate is thinned to expose the insulator, as shown in step S30. Then, a portion of the insulator is removed to form a hole, as shown in S35. A conductive layer is next formed on a backside of the substrate and is extended to the hole to form a via hole, as shown in step S40. Next, a solder ball is formed on the conductive layer, electrically connecting to the metal layer, as shown in steps S45. Following the described steps, a dicing step is executed to complete fabrication of the image sensor package, as shown in step S50.

Note that because the substrate is thinned, the overall thickness of the image sensor package is reduced. Thus, the image sensor package according to the embodiment of the invention has relatively small dimensions. Moreover, because extra steps, such as the attaching step for bonding a chip to a carrying plate or the etching step for separating the chip are not required, fabrication of the image sensor package is simplified and costs are reduced. Additionally, because the signal from the image sensor device can be transmitted to the solder ball by via the hole, rather than the conductive layer formed close to an exterior area of the image sensor package, the signal conductive path is not only shortened, but damage to the conductive layer during fabrication is also reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabricating method of a package, comprising:
providing a substrate with a semiconductor device and an electrode layer electrically connected to the semiconductor device;
forming a cavity in a front surface of the substrate;
filling the cavity with an insulator, wherein the insulator in the cavity is completely covered with the electrode layer;
disposing a covering plate over the front surface of the substrate;
forming a support member on the covering plate;
defining a wafer scribe channel under the support member;
thinning a bottom surface of the substrate to expose the insulator, wherein a bottom surface of the insulator is level with the bottom surface of the substrate after the step of thinning;
forming an insulating layer covering the bottom surface of the substrate and the entire bottom surface of insulator;
removing an inner portion of the insulator to form a hole surrounded by an outer portion of the insulator;

filling a conductive layer within the hole and producing an electrical connection between the conductive layer and the electrode layer; and forming a solder bump under the conductive layer.

2. The method as claimed in claim 1, wherein the cavity is formed by etching the front surface of the substrate.

3. The method as claimed in claim 1, wherein the step of disposing the covering plate is prior to thinning the bottom surface of the substrate.

4. The method as claimed in claim 1, wherein the step of forming the support member is prior to disposing the covering plate, and prior to disposing the covering plate further comprising:

coating an adhesive layer on the support member to be attached to the front surface of the substrate.

5. The method as claimed in claim 1, wherein the conductive layer is further extended to the bottom surface of the substrate.

6. The method as claimed in claim 1, wherein the substrate is thinned by chemical mechanical polishing.

7. The method as claimed in claim 1, wherein the insulator is partially removed by dry-etching.

8. The method as claimed in claim 1, wherein the insulator comprises polymer material.

9. The method as claimed in claim 1, wherein the insulating layer is extended into the wafer scribe channel.

10. A fabricating method of a package, comprising:
providing a substrate with a semiconductor device and an electrode layer electrically connected to the semiconductor device;
forming a cavity from a front surface of the substrate;
filling the cavity with an insulator, wherein the insulator in the cavity is completely covered with the electrode layer;
disposing a covering plate over the front surface of the substrate;
forming a support member on the covering plate;
defining a wafer scribe channel under the support member;
thinning a bottom surface of the substrate to expose the insulator, wherein a bottom surface of the insulator is level with the bottom surface of the substrate after the step of thinning;
forming an insulating layer covering the bottom surface of the substrate and the entire bottom surface of the insulator;
partially removing the insulator from the bottom surface of the substrate to form a hole isolated from the substrate;
forming a conductive layer within the hole; and
forming a solder bump under the conductive layer.

11. A fabricating method of a package, comprising:
providing a substrate with a semiconductor device and an electrode layer electrically connected to the semiconductor device;
forming a cavity in a front surface of the substrate;
filling the cavity with an insulator, wherein the insulator in the cavity is completely covered with the electrode layer;
forming a covering plate over the front surface of the substrate, wherein the covering plate is not electrically connected to the substrate;
thinning a bottom surface of the substrate to expose the insulator, wherein a bottom surface of the insulator is level with the bottom surface of the substrate after the step of thinning;
forming an insulating layer covering the bottom surface of the substrate and the entire bottom surface of insulator;
removing an inner portion of the insulator to form a hole surrounded by an outer portion of the insulator;
filling a conductive layer within the hole and producing an electrical connection between the conductive layer and the electrode layer; and
forming a solder bump under the conductive layer.

12. The method as claimed in claim 11, wherein the cavity is formed by etching the front surface of the substrate.

13. The method as claimed in claim 11, wherein the step of forming the covering plate is prior to thinning the bottom surface of the substrate.

14. The method as claimed in claim 11, wherein the conductive layer is further extended to the bottom surface of the substrate.

15. The method as claimed in claim 11, wherein the substrate is thinned by chemical mechanical polishing.

16. The method as claimed in claim 11, wherein the insulator is partially removed by dry-etching.

17. The method as claimed in claim 11, wherein the insulator comprises polymer material.

18. The method as claimed in claim 13, prior to forming the covering plate, further comprising:
forming a support member on the covering plate; and
coating an adhesive layer on the support member to be attached to the front surface of the substrate.

19. The method as claimed in claim 18, further comprising a step of defining a wafer scribe channel under the support member.

20. The method as claimed in claim 19, wherein the insulating layer is extended into the wafer scribe channel.

* * * * *